(12) United States Patent
Torek et al.

(10) Patent No.: US 7,261,835 B2
(45) Date of Patent: *Aug. 28, 2007

(54) ACID BLEND FOR REMOVING ETCH RESIDUE

(75) Inventors: Kevin J. Torek, Meridian, ID (US); Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

This patent is subject to a terminal disclaimer.

(21) Appl. No.: 10/338,845

(22) Filed: Jan. 9, 2003

(65) Prior Publication Data

US 2003/0222241 A1  Dec. 4, 2003

Related U.S. Application Data

(63) Continuation of application No. 09/632,088, filed on Aug. 2, 2000, now Pat. No. 6,517,738, which is a continuation of application No. 09/340,669, filed on Jun. 29, 1999, now Pat. No. 6,453,914.

(51) Int. Cl.
*C09K 13/00* (2006.01)

(52) U.S. Cl. .................. 252/79.1; 252/79.2; 252/79.3; 510/175

(58) Field of Classification Search .......... 252/79.1, 252/79.2, 79.3, 79.4; 510/175
See application file for complete search history.

(56) References Cited

U.S. PATENT DOCUMENTS

| | | | |
|---|---|---|---|
| 4,069,074 A | * | 1/1978 | Yanushonis et al. ........ 438/545 |
| 4,314,855 A | | 2/1982 | Chang et al. |
| 5,340,437 A | | 8/1994 | Erk et al. |
| 5,389,194 A | | 2/1995 | Rostoker et al. |
| 5,478,436 A | | 12/1995 | Winebarger et al. |
| 5,496,485 A | | 3/1996 | Maternaghan |
| 5,800,725 A | | 9/1998 | Kato et al. |
| 5,817,185 A | | 10/1998 | Shindo et al. |
| 5,855,811 A | | 1/1999 | Grieger et al. |
| 5,972,862 A | | 10/1999 | Torii et al. |
| 6,008,138 A | * | 12/1999 | Laermer et al. ............ 438/725 |

(Continued)

FOREIGN PATENT DOCUMENTS

JP  49-130688  12/1974

(Continued)

OTHER PUBLICATIONS

"General Chemistry" by Nefergall et al., D.C. Health & Co., 1976, pp. 681.*

*Primary Examiner*—George A. Goudreau
(74) *Attorney, Agent, or Firm*—Dickstein Shapiro LLP

(57) ABSTRACT

A method for removing organometallic and organosilicate residues remaining after a dry etch process from semiconductor substrates. The substrate is exposed to a conditioning solution of phosphoric acid, hydrofluoric acid, and a carboxylic acid, such as acetic acid, which removes the remaining dry etch residues while minimizing removal of material from desired substrate features. The approximate proportions of the conditioning solution are typically 80 to 95 percent acetic acid, 1 to 15 percent phosphoric acid, and 0.01 to 5.0 percent hydrofluoric acid.

4 Claims, 3 Drawing Sheets

U.S. PATENT DOCUMENTS

| | | |
|---|---|---|
| 6,012,469 A | 1/2000 | Li et al. |
| 6,106,689 A * | 8/2000 | Matsuyama ................. 205/333 |
| 6,192,899 B1 | 2/2001 | Li et al. |
| 6,453,914 B2 * | 9/2002 | Torek et al. ................. 134/1.2 |
| 6,517,738 B1 * | 2/2003 | Torek et al. ............... 252/79.1 |

FOREIGN PATENT DOCUMENTS

| | | | |
|---|---|---|---|
| JP | 04-088178 | * | 3/1992 |
| JP | 06-041770 | | 2/1994 |
| JP | 07-183288 | | 7/1995 |

* cited by examiner

ACID BLEND FOR REMOVING ETCH RESIDUE

This application is a continuation application of U.S. patent application Ser. No. 09/632,088, filed Aug. 2, 2000 now U.S. Pat. No. 6,517,738, which in turn is a continuation of U.S. patent application Ser. No. 09/340,669, filed Jun. 29, 1999 now U.S. Pat. No. 6,453,914, the entirety of each are incorporated by reference herein.

FIELD OF THE INVENTION

The present invention relates to the fabrication of semiconductor devices and more particularly to a method for cleaning a semiconductor substrate after the formation of dry etch residues thereon.

BACKGROUND OF THE INVENTION

The importance of minimizing contamination during semiconductor fabrication processes has been recognized since the early days of the industry. As semiconductor devices have become smaller and more complex, cleanliness requirements have become increasingly stringent, especially for devices with submicron critical dimensions, because the ability to reliably create multi-level metallization structures is increasingly vital. The importance of cleaning and conditioning steps during the device fabrication process is also emphasized because small-scale residues that may not have seriously affected the performance of devices with large geometries may result in disabling defects in submicron devices.

Dry etch processes play a key role in developing multi-level metallization structures on semiconductor substrates. The step of transferring the desired pattern from the photoresist into the substrate is often accomplished via a dry etch process. While dry etch processes are effective for selectively etching the substrate in only the areas not masked by photoresist, these processes have a tendency to leave behind residues on the substrate. Although these residues may serve a beneficial role during a dry etch process, they are undesirable after the completion of the dry etch process. In back end of the line processes, where both dielectrics, such as $SiO_2$, and metals, such as Al or W, are present, the residues left behind by dry etch processes may include both organometallic and organosilicate species. These undesirable post-etch residues are often difficult to remove without damaging the desired substrate features.

Current methods for removing dry etch residues have met with only limited success. Traditional cleans involving aqueous acid solutions can not provide a general solution for removing these residues, as these processes are not suitable for processing in the presence of metal lines. Current strategies often involve treating substrates with solutions containing hydroxylamine ($NH_2OH$) and an organic chelating agent. These methods have shown some effectiveness but have significant drawbacks. These types of solutions can cause corrosion of exposed metal on the wafer and usually require long processing times at temperatures near 100 C. These hydroxylamine solutions are also expensive, as the chemicals are not only expensive to purchase but also typically require specialized disposal.

As the removal of dry etch residues grows increasingly troublesome in microelectronic device manufacture, there is a need for an effective method of removal of these residues which can be easily implemented in standard wafer processing equipment and has reduced costs for chemical purchase and disposal.

SUMMARY OF THE INVENTION

The present invention provides a method for removing organometallic and organosilicate residues from a semiconductor substrate following a dry etch process. A substrate previously subjected to a dry etch process is exposed to a conditioning solution to remove residues remaining after the dry etch. The conditioning solution is a solution of a suitable carboxylic acid, such as acetic acid, phosphoric acid, and hydrofluoric acid. The substrate is exposed to the solution for a period of time sufficient to remove the dry etch residues. After exposure, the substrate can be rinsed with either deionized water or with an aqueous acidic solution.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that structural and chemical changes may be made without departing from the spirit and scope of the present invention.

The terms "wafer" and "substrate" are to be understood as including any semiconductor-based structure having an exposed layer which may be effectively cleaned by the process of the present invention. Typically this will include semiconductor-based structures which have been dry-etched and have resultant organometallic and/or organosilicate residues on an exposed layer, but other structures may also be beneficially treated by the present inventive method. "Wafer" or "substrate" may include silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The following detailed description is, therefore, not to be taken in a limiting sense, and the scope of the present invention is defined by the appended claims. When referring to solutions described herein, the term "percent" refers to the percent measured by weight, e.g., a 90% acetic acid solution is 90% by weight acetic acid.

Figure 1:
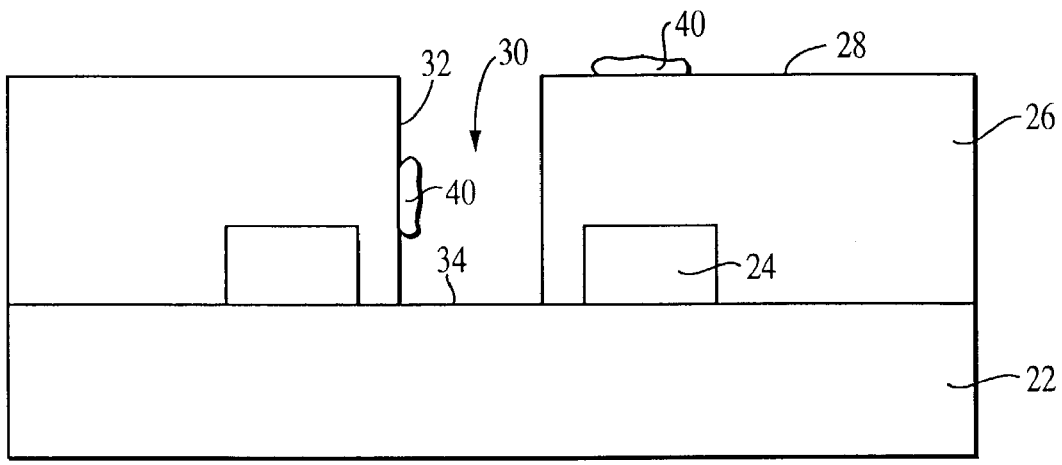
FIG. 1 is a schematic cross-sectional view of a substrate with dry etch residues near a sample device feature.

Referring now to the drawings, where like elements are designated by like reference numerals, FIG. 1 depicts a semiconductor wafer 20 in an intermediate processing stage of a fabrication process. The wafer 20 comprises a substrate 22 with devices 24 located thereon. The devices 24 are covered by a dielectric layer 26 of $SiO_2$, BPSG, or other suitable material which has a top surface 28. A device feature that has been formed by a dry etch process is formed on the substrate 22, either on or in the dielectric layer 26. For exemplary purposes, the device feature will be illustrated and described as a trench 30, which may be a via, but it should be understood that the invention is not limited thereto.

The trench 30 is formed in the dielectric material, and has sidewalls 32 and a bottom surface 34, which may be composed of a metal such as aluminum or tungsten. The wafer 20 of FIG. 1 has been subjected to a dry etch process followed by a photoresist ashing or stripping process. Due to the dry etch process residues 40, which may be, for example, organosilicate or organometallic residues, are present on the top surface 28 of the dielectric layer 26 and on the sidewalls 32 of the trench 30. If not removed, the residues 40 could prevent proper deposition of subsequent layers in the trench 30 or on the dielectric layer 26.

An embodiment of the present invention for removing residues is illustrated by FIGS. 2 through 5. This embodiment uses a conditioning solution to cleanse the substrate surface after performance of a dry etch. The conditioning solution is a solution of phosphoric acid, hydrofluoric acid, and a solvating acid. The solvating acid is composed of one or more carboxylic acids. In a preferred embodiment, the solvating acid is acetic acid. In another embodiment, the solvating acid is formic acid. In other embodiments, the solvating acid may be composed of a mix of carboxylic acids, such as a mixture of formic acid and acetic acid. The substrate 22 is exposed to the conditioning solution for a period of time sufficient to remove residues 40 from the substrate surface while minimizing the amount of material removed from exposed surfaces, such as metal lines, vias, or dielectric layers.

Figure 2:
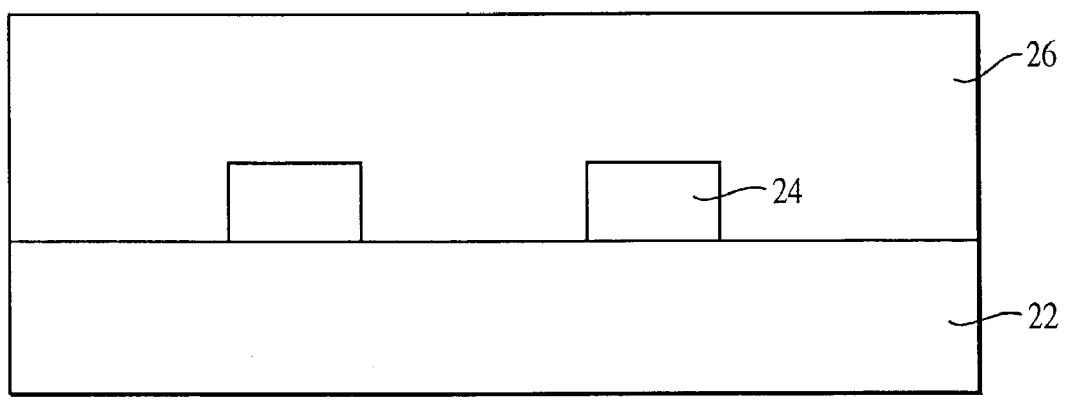
FIG. 2 is a schematic cross-sectional view of a substrate undergoing the process of a preferred embodiment of the invention.

Referring to FIG. 2; the process of the present invention begins subsequent to the formation of devices 24, which may be transistors, capacitors, word lines, bit lines, or the like, on a substrate 22 of a wafer 20, and the formation of a dielectric layer 26 on the substrate 22. The dielectric layer 26 may be a silicon dioxide, borophosphosilicate glass (BPSG), phosphosilicate glass (PSG), borosilicate glass (BSG) or other dielectric layer, and may be deposited by chemical vapor deposition or other suitable means.

Figure 3:
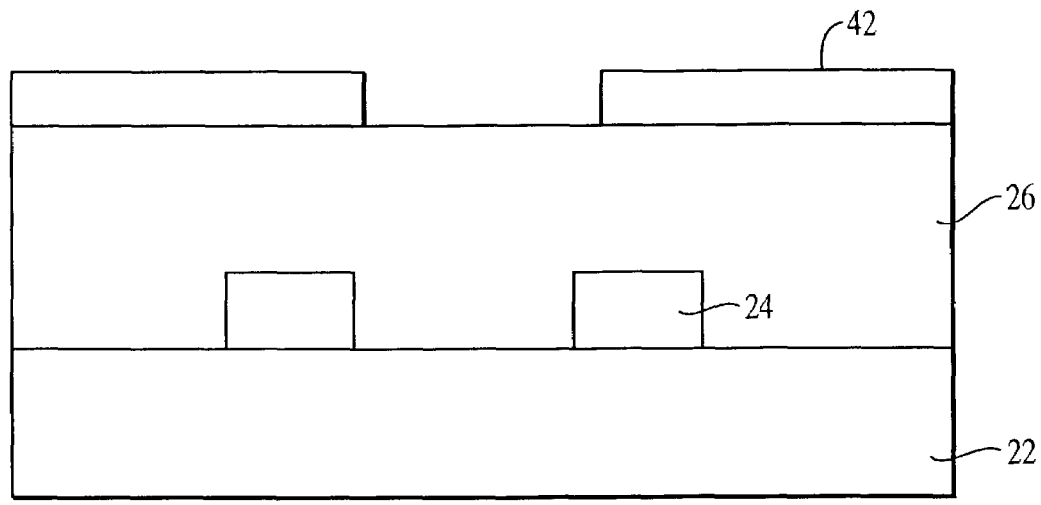
FIG. 3 shows the substrate of FIG. 2 at a processing step subsequent to that shown in FIG. 2.
Figure 4:
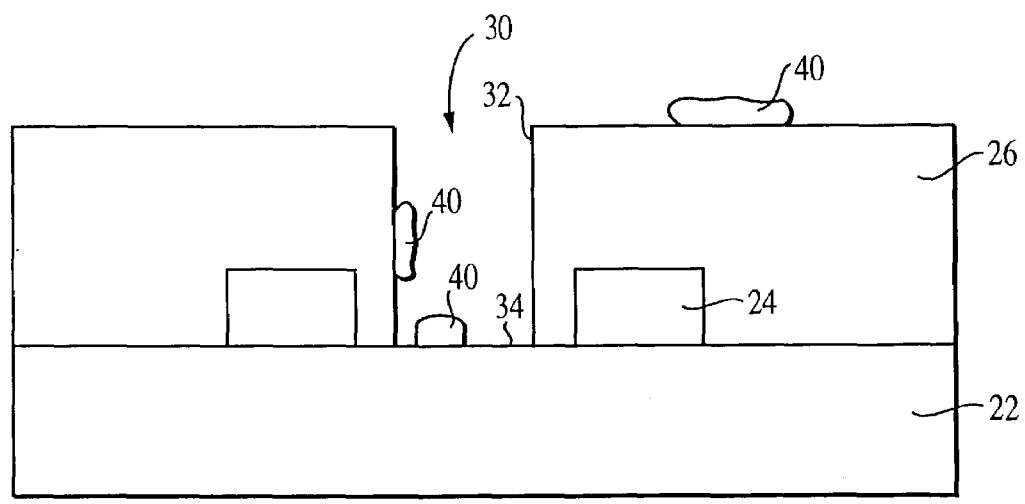
FIG. 4 shows the substrate of FIG. 2 at a processing step subsequent to that shown in FIG. 3.

FIG. 3 depicts the next step of the process, in which a photoresist 42 is formed on the top surface 28 of the dielectric layer 26 by suitable means such as spinning. The photoresist 42 is patterned and developed, and a dry etch process is performed using the patterned photoresist. After the dry etch process has been performed, and the photoresist has been removed by means such as ashing or stripping, residues 40 remain on the top surface 28 of the dielectric layer 26, and inside the trench 30, as shown in FIG. 4.

The wafer 20 is then subjected to the cleansing process of the present invention. The wafer 20 is exposed to a conditioning solution by any suitable method, which is typically a wet processing method. Suitable methods may involve immersion of the wafer 20, either singly or in combination with other wafers, into a bath containing the conditioning solution, or by dispensing of the conditioning solution onto one or more wafers 20 as a stream or spray, so long as such dispensing of the conditioning solution results in exposure of the surface of the substrate to the conditioning solution for the desired length of time. Other methods of treating substrates with the conditioning solution will be apparent to those skilled in the art. The wafer 20 is exposed to the conditioning solution for a time sufficient to remove residues 40 from the top surface 28 of the dielectric layer 26 and from the sidewalls 32 and bottom surface 34 of the trench 30. Residues 40 may be organometallic residues, organosilicate residues, other post-etch residues, or a combination of these residues. The cleansing method of this invention is effective for removal of these residues when present individually or in combination.

The wafer 20 may then be rinsed to prepare the substrate for a subsequent process step. In one embodiment, the substrate is rinsed with deionized water. In a preferred embodiment, the substrate may be exposed to an acidic rinse composed of an aqueous solution of a suitable acid. Carboxylic acids such as citric acid) acetic acid, or EDTA (ethylene diamine tetraacetic acid) are preferred for this embodiment. Other organic acids which are not carboxylic acids may also be used, such as ascorbic acid.

In another embodiment, the aqueous acid solution may be buffered to raise the pH of the solution to any desired pH level up to approximately pH 8. In yet another embodiment, anti-etch agents may be added to the rinse bath, such as ammonium lactate or boric acid. In another embodiment, the substrate may be rinsed by exposing the wafer to an organic solvent, such as an alcohol, a polyhydric alcohol (such as propylene glycol), a ketone, or a fluorocarbon. In another embodiment, the rinse may be carried out in a bath and the rinse bath may be agitated by introduction of a gas. The agitating gas may be $CO_2$, $N_2$, or other gases which can be conveniently introduced into the rinse bath for agitation. In yet another embodiment, the solution may be agitated using megasonic energy. In still another embodiment, the solution may be agitated by manual or robot-controlled shaking of the vessel containing the rinse bath.

Use of the acidified rinse or buffered rinse greatly reduces the potential for unwanted consumption of the desired substrate materials after exposing the wafer to the conditioning solution. In embodiments where rinsing is accomplished with a rinse bath, a gas may be bubbled through the rinse bath. When the gas is $CO_2$, introduction of the gas provides another means for acidifying the rinse water as well due to the formation of carbonic acid. When the rinse is already acidified, however, inert gases such as $N_2$ exhibit similar effectiveness to $CO_2$. In some applications of this method, either the wafer may not be susceptible to the unwanted consumption of the substrate or additional loss of substrate material may not be critical. In these cases the wafer may be rinsed with deionized water.

In still another embodiment, the wafer 20 may be pre-rinsed with a non-aqueous solvent prior to the rinse step. In one embodiment, the non-aqueous solvent is a polyhydric alcohol, such as propylene glycol. In another embodiment, the wafer is pre-rinsed with the same non-aqueous solvent used in the conditioning solution. After pre-rinsing the wafer with a non-aqueous solvent, the wafer may be rinsed with any of the rinses described above.

Figure 5:
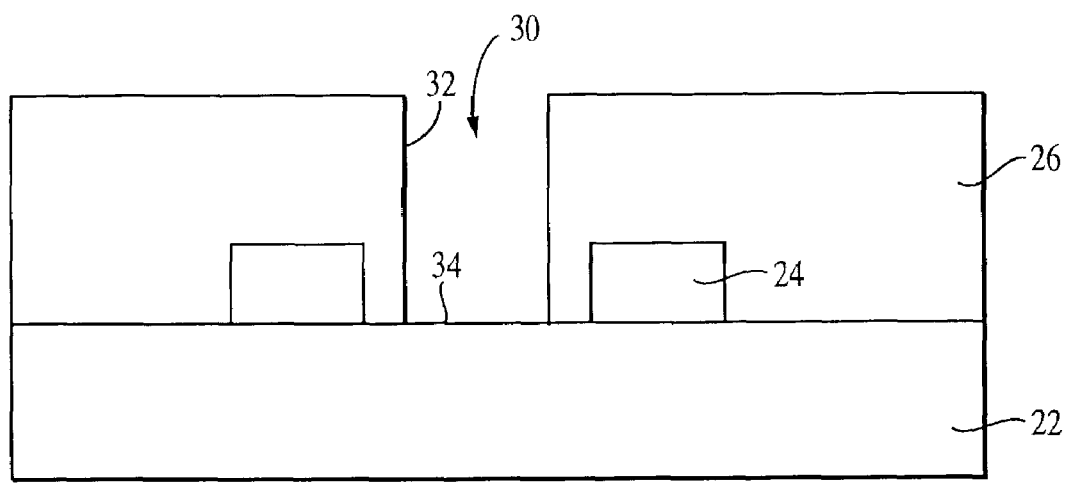
FIG. 5 shows the substrate of FIG. 2 at a processing step subsequent to that shown in FIG. 4.

The exact nature and length of the rinse step may vary depending on the next process step the substrate will undergo. The wafer 20 may be spin-dried after rinsing, if appropriate. The final structure of the wafer 20 with the residue removed is shown in FIG. 5. Further steps to create a functional circuit from the wafer 20 may now be carried out.

In a preferred embodiment, the conditioning solution is a solution of acetic acid, phosphoric acid, and hydrofluoric acid. By weight, the conditioning solution is predominantly composed of acetic acid, and is preferably approximately 80 to approximately 95 percent acetic acid. The conditioning solution also contains approximately 1 to approximately 15 percent phosphoric acid and approximately 0.01 to approximately 5.0 percent hydrofluoric acid. A preferred conditioning solution comprises approximately 90 to approximately 94 percent acetic acid, approximately 6 to approximately 7 percent phosphoric acid, and approximately 0.25 to approximately 0.3 percent hydrofluoric acid. A particularly preferred conditioning solution comprises about 91.5 percent acetic acid, about 6.5 percent phosphoric acid, about 0.27 percent hydrofluoric acid. In all of the above conditioning solutions, the balance of the solution weight is made up by water. In many embodiments, the conditioning solution is prepared by combining stock acid solutions which contain water, so a small amount of water may be present in the conditioning solution. It is preferred, however, that the water content of the conditioning solution be as low as possible.

In other embodiments, a suitable conditioning solution may be prepared by other combinations of chemicals. Although HF is preferred, other fluorine sources may be effectively employed within the scope of this invention. For example, $NH_4F$ might be employed as the fluorine source as long as the $NH_4F$ was compatible with the other components selected for the conditioning solution. Similarly, $H_3PO_4$ is not the only source of phosphate contemplated within the inventive method. For example, phosphate salts which could dissociate to yield $H_2PO_4^-$, $HPO_4^{2-}$, or $PO_4^{3-}$ might be appropriate depending on the other components in the conditioning solution. HF and $H_3PO_4$, however, are particularly preferred and convenient choices for the fluorine source and the phosphate source.

Residue removal with the conditioning solution may be performed at temperatures of approximately 5 to approximately 60 degrees Celsius. Temperatures below 5 degrees Celsius may be used, but are not as favorable due to decreased residue removal speeds. As a result, at lower temperatures the conditioning solution may need to be applied to the substrate for longer periods of time, leading to lower throughput in a production setting. Additionally, the tendency of acetic acid to solidify near room temperature may provide a lower limit to the temperatures which may be used. Temperatures above 60 degrees Celsius may also be used, but at higher temperatures the vapor pressure of the conditioning solution may become significant. This can lead to excessive fume production when the method is performed in an wet bench environment. Preferably, the substrate is exposed to the conditioning solution at a temperature of approximately 35 to approximately 40 degrees Celsius. Exposing the substrate to the conditioning solution at a temperature of approximately 38 degrees Celsius is a particularly preferred embodiment of this invention.

Preferably, the substrate is exposed to the conditioning solution for a period of time sufficient to remove any undesirable dry etch residues from the surface of the substrate. This may involve an exposure of the substrate to the conditioning solution for periods of time ranging from about 60 seconds to about 180 seconds or longer depending on the exact nature of the substrate, the residues targeted for removal, and the process temperature. Longer exposure times allow for greater removal efficiency of the dry etch residues but will also lead to lower throughput in a production setting. Also, depending on the exact nature of the substrate, longer exposures to the conditioning solution may eventually lead to removal of material from exposed features on the surface of the substrate, such as metal lines, vias, or dielectric surfaces. As a result, the optimal amount of time for exposure of a substrate to-the conditioning solution will be substrate dependent. The preferred exposure time could be near 60 seconds, near 180 seconds, or a longer or shorter period of time depending on the exact nature of the target substrate.

Without being bound by any particular theory, it is currently believed that several factors contribute to the effectiveness of this method for removing dry etch residues. It is believed that the acetic acid, or other solvating acid, plays a role by passivating the surface of exposed metal lines, especially aluminum lines, which are on the surface of the substrate. It is believed that the phosphoric acid and hydrofluoric acid play complementary roles of aiding in the removal of organometallic and organosilicate residues, respectively.

It is also believed that the acetic acid, or other solvating acid, plays a further role in the conditioning solution. Due to the high concentration of carboxylic acid (>80%), the effective pH of the conditioning solution is below 1. As a result, the hydrofluoric acid present in the conditioning solution tends to exist as molecular HF and $H_2F_2$, as opposed to undergoing dissociation into $H^+$, $F^-$, $HF^{2-}$, or any of the other likely species produced when HF dissociates in solution. By preventing dissociation of the HF present in the conditioning solution, the HF is forced to remain in its molecular form which generally reacts much more slowly with substrate materials such as $SiO_2$ or the aluminum lines likely to be exposed on a substrate surface. This depression of the reaction rate greatly reduces the potential for damage to the desired substrate features during exposure of the substrate to the conditioning solution.

An alternate theory which could explain the lack of reactivity with the aluminum lines is that the nature of the conditioning solution suppresses the solubility of aluminum fluoride. Aluminum fluoride is one of the likely products of any reaction involving aluminum lines on the surface of the substrate. Lowering the solubility of aluminum fluoride might cause this reaction product to build up at the surface of the aluminum lines and prevent further reaction.

As can be seen from the embodiments described herein, the present invention encompasses processes of removing dry etch residues from substrates having exposed areas of both metal and dielectric. The substrate is treated with/ exposed to a conditioning solution composed of a solvating acid (typically acetic acid), phosphoric acid, and hydrofluoric acid. The conditioning solution efficiently removes organometallic, organosilicate, and other dry etch residues with minimal impact on exposed features on the substrate surface.

The above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A solution for use in removing residues remaining on a semiconductor substrate after a dry etch process, said solution consisting essentially of a solvating acid, phosphoric acid and hydrofluoric acid, wherein said solvating acid is provided in a percentage less than approximately 95%, and wherein said phosphoric acid is provided in a percentage of approximately 1 to approximately 15%, wherein said solvating acid is formic acid.

2. A solution for use in removing residues remaining on a semiconductor substrate after a dry etch process, said solution consisting essentially of a solvating acid, phosphoric acid and hydrofluoric acid, wherein said solvating acid is provided in a percentage less than approximately 95%, and wherein said phosphoric acid is provided in a percentage of approximately 1 to approximately 15%, wherein said solvating acid is a mixture of formic acid and acetic acid.

3. A solution for use in removing residues remaining on a semiconductor substrate after a dry etch process, said solution consisting of a solvating acid, phosphoric acid and hydrofluoric acid, wherein said solvating acid is provided in a percentage less than approximately 95%, and wherein said phosphoric acid is provided in a percentage of approximately 1 to approximately 15%, wherein said solvating acid is formic acid.

4. A solution for use in removing residues remaining on a semiconductor substrate after a dry etch process, said solution consisting of a solvating acid, phosphoric acid and hydrofluoric acid, wherein said solvating acid is provided in a percentage less than approximately 95%, and wherein said phosphoric acid is provided in a percentage of approximately 1 to approximately 15%, wherein said solvating acid is a mixture of formic acid and acetic acid.

* * * * *